United States Patent [19]

Kim et al.

[11] Patent Number: 5,308,784
[45] Date of Patent: May 3, 1994

[54] SEMICONDUCTOR DEVICE AND METHOD FOR MAKING THE SAME

[75] Inventors: Yungi Kim, Kangwon-do; Byeongyeol Kim, Kyungki-do; Soohan Choi, Seoul, all of Rep. of Korea

[73] Assignee: Samsung Electronics Co., Ltd., Kyungki-do, Rep. of Korea

[21] Appl. No.: 955,108

[22] Filed: Oct. 1, 1992

[30] Foreign Application Priority Data

Oct. 2, 1991 [KR] Rep. of Korea ............. 91-17324
Oct. 2, 1991 [KR] Rep. of Korea ............. 91-17326

[51] Int. Cl.⁵ ............................................. H01L 21/76
[52] U.S. Cl. ............................................. 437/67; 437/61; 437/69; 437/72; 148/DIG. 50
[58] Field of Search ............... 437/67, 63, 61, 69, 437/72; 148/DIG. 50

[56] References Cited

U.S. PATENT DOCUMENTS

| | | | |
|---|---|---|---|
| 4,799,990 | 1/1989 | Kerbaugh et al. | 437/67 |
| 5,004,703 | 4/1991 | Zdebel et al. | 437/72 |
| 5,096,848 | 3/1992 | Kawamura | 437/69 |
| 5,229,315 | 7/1993 | Jun et al. | 437/67 |

FOREIGN PATENT DOCUMENTS

| | | | |
|---|---|---|---|
| 0181639 | 10/1984 | Japan | 437/67 |
| 0219938 | 12/1984 | Japan | 437/67 |
| 0241231 | 11/1985 | Japan | 437/67 |
| 0023649 | 1/1991 | Japan | 437/67 |
| 8804106 | 6/1988 | World Int. Prop. O. | 437/67 |

Primary Examiner—Brian E. Hearn
Assistant Examiner—Trung Dang
Attorney, Agent, or Firm—Francis C. Hand

[57] ABSTRACT

There is disclosed in the present invention a method for manufacturing a semiconductor device including an isolation region defined by trenches having different or equal widths respectively on a single semiconductor substrate comprising the steps of:

forming insulating films on the semiconductor substrate and then forming an aperture on a passive region (isolation region);

forming spacers of etch rate different from that of the insulating films on sidewalls of the aperture to define ring-shaped trench regions surrounding outline of active regions;

forming another insulating film of etch rate different from that of the spacers on the substrate where the spacers are defined and removing the spacers by etching to expose the substrate within the etched spacers; and forming trenches on the exposed area of the substrate, forming an insulating film of equal character to that of the insulating films used at the time of the formation of the aperture to refill the trenches and forming the spacers on the sidewalls of the insulating film in the passive region, thereby forming ring-shaped trenches surrounding the outlines of the active regions to be an isolation region.

11 Claims, 6 Drawing Sheets

SEMICONDUCTOR DEVICE AND METHOD FOR MAKING THE SAME

BACKGROUND OF THE INVENTION

1. Field of the Invention

The present invention relates to the isolation of electrical elements of semiconductor devices. More particularly, the invention relates to a method of the isolation of electrical elements of semiconductor devices by means of trenches, and a semiconductor device having isolation regions according to the method of the present invention.

2. Description of the Prior Art

A trench technique for isolating several electrical elements included on a single chip in semiconductive integrated circuit devices has been used in recent semiconductor manufacture. This technique adapts a method for isolating electrical elements from each other by forming trenches on a semiconductor substrate through dry-etching and refilling the trenches with insulating materials. This reduces parasitic capacitance caused by packing the elements closer to each other to increase the density of the elements on the substrate.

FIG. 1 illustrates a semiconductor device having active regions 1 on which electrical elements are formed and which are isolated from neighboring active regions 1 by trenches 2, i.e. an isolation region.

The process for making the trenches 2 to isolate the electrical elements from each other is depicted in FIGS. 2A to 2E, which are sectional views taken along lines A—A' of FIG. 1.

As shown in FIG. 1, the trenches 2 may be narrow trenches 3 or relatively wide too.

The process for making the conventional trenches of FIG. 2 will now be described.

This process begins with the formation of a silicon pad oxide film 6 of a predetermined thickness on a silicon substrate 5 by a thermal oxidation treatment or a chemical vapor deposition. A silicon nitride layer (SiN) 7 is deposited on the pad oxide film 6 by a low pressure chemical vapor deposition (CVD), and a high temperature oxide film (HTO) 8 is formed thereon. These films serves as a masking layer when the silicon substrate 5 is selectively etched.

Subsequently, in order to distribute the surface of the substrate into each area, a photoresist film 9 is spin-coated on the high temperature oxide film 8, and exposed to light by photomask and developed to carry out a patterning process. The widths of apertures on which the photoresist film is removed, as shown in FIG. 2A, are different from each other, and these regions 3 and 4 define trench regions that are to be formed.

The high temperature oxide film 8 is selectively etched through dry-etching, (FIG. 2B) according to the patterns defined by the photoresist films 9. Parts of the nitride layer 7 and oxide film 6 underneath the apertures are then successively etched to be removed, using the high temperature oxide film 8 as an etching mask, and trenches are formed to a predetermined depth with an anisotropic etch step, as can be seen from FIG. 2C. A thin oxide film 10 is then formed on the inside of the trenches by a thermal oxidation process, (FIG. 2C) and the trenches are refilled with, e.g. a high temperature oxide film 11 (FIG. 2D). Due to the width difference between the narrow trench 3 and the broad trench 4, the narrower trench 3 is refilled enough to be higher than the high temperature oxide film 8'. On the other hand, the inside of the wider trench 4 is not refilled sufficiently, and the refilled layer inside the narrower trench 3 has a dimple D in the center thereof, ad shown in FIG. 2D.

Under the circumstances, the high temperature oxide film 11 refilled in the trenches and the high temperature oxide film 6 8' on the silicon nitride layer 7 are etched away through anisotropic etching, and the nitride layer 7 and the pad oxide film are etched away by a wet-etching method to expose the active regions of the substrate 5. The isolation region is then formed by the trenches, as shown in FIG. 2E, and electrical elements are formed on the active regions between the trenches.

As shown in the sectional structure of FIG. 2E, however, a step-like difference of the trench-refill material obviously appears according to the trench width, and this may cause a deterioration in step coverage of films deposited on the trench-refill material. For example, when a metal oxide semiconductive element is formed on the active regions and its gate electrode is expansively formed across the trench, delayed signals may be caused due to this step-like difference.

If the trenches of widely varying widths are filled, the narrow trench must be well overfilled in order for the wider one to be filled completely. Thus, the thickness of the top-surface-deposited film may vary, making planarization very difficult.

This is one reason why deep trenches refilled with CVD polysilicon of SiO2 cannot replace a process known as localized oxidation of silicon for isolation of elements (LOCOS) as an isolation technique for field regions of varying widths.

SUMMARY OF THE INVENTION

An object of the present invention is to solve the abovementioned conventional disadvantage, and to provide a method for manufacturing a semiconductor device including an isolation region defined by trenches having different or equal widths respectively on a single semiconductor substrate.

Another object of the present invention is to provide an isolation technique using trenches so as to have a planarized surface of an isolation region without reference to a width of the isolation region, and to carry out good isolation processes.

Still another object of the present invention is to provide the steps in the manufacture of and isolation region without extra etching processes for planarization, by performing a trench refilling process through thermal oxidation.

A further object of the present invention is to provide an isolation technique for forming a trench-structure so as to planarize an isolation region to be in the same level of an active region and isolate electrical elements from each other as well.

Briefly, the present invention provides a method for manufacturing a semiconductor device having an isolation region, comprising the steps in the formation of the isolation region of:

partially etching insulating layers which have been deposited on a substrate to form at least one passive region;

forming a pair of spacers on opposite sides of each passive region with each space being of a predetermined width while peripherally surrounding an active region on the substrate;

thereafter forming a layer of an insulating film between the spacers in each passive region;

thereafter removing the spacers by etching and forming trenches on the exposed area of the substrate defined by the spacers; and thereafter filling the trenches with an oxide material.

In one embodiment, the insulating film between the spacers is a silicon nitrite film and is left in place.

In another embodiment, the insulating film between the spacers of each passive region is in the form of a thermal oxide layer which is removed prior to filling of the trenches with a thermal oxide material. In this embodiment, when the trenches are filled with the thermal oxide material, a layer of the oxide is formed across the passive region with an exposed planar surface.

BRIEF DESCRIPTION OF THE DRAWINGS

The above and further objects, features and advantages of the present invention will become more apparent from the following detailed description of embodiments taken in conjunction with the accompanying drawings, wherein:

FIGS. 4A to 4C, 4C-1 to 4C-2, 4D to 4G illustrate steps in the manufacture of a semiconductor device according to the present invention, as taken along lines B—B′ of FIG. 3;

DESCRIPTION OF THE PREFERRED EMBODIMENTS

Figure 3:
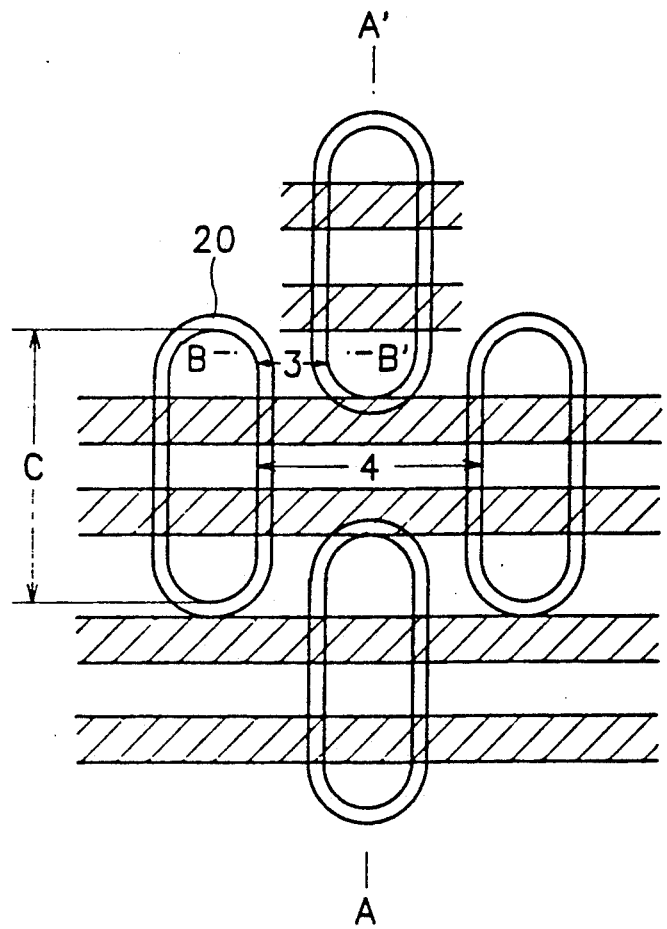
FIG. 3 depicts a first preferred embodiment of the present invention, and is a plan view of a semiconductor device having the isolation region according to the present invention.

FIG. 3 depicts a plan view of a semiconductor device having isolation regions according to the present invention.

Active and passive regions are formed in a conventional manner, and the isolation of each electrical element is effected by a ring-shaped trench 20 formed to surround the outlines of the active region. There is no need to refill the inside of a wider trench 4, and the present invention can solve the problems of creating step-like difference and connecting signal lines thereby. Furthermore; a narrower trench 3 is also formed to be in the same configuration as that of the wider trench 4, and so a conventional dimple cannot be formed in the center of the narrower trench 3.

The terms of "narrower" and "wider" for the trenches 3 and 4 are used just for comparison between the present invention and a conventional art technology, and it should be noted that the ring-shaped trenches of the present invention have the same width as each other, and surround the active regions without reference to conventional narrow and wide trenches.

In FIG. 3, a gate electrode line which crosses horizontally over the active regions of vertically long configuration can be placed to be nearly planar without big step-like difference. Since the spacer width can be easily controlled and narrowly formed according to the manufacturing process of the present invention, the present invention provides fabrication steps appropriate for high integration, and can make active regions form definitely. The trench refilling can be also carried out without any flaw.

Preferred embodiments of the present invention will now be fully described referring to FIGS. 4A to 4G and FIG. 5.

As shown in FIG. 3, the active regions are placed in an islandlike configuration on the silicon substrate. Each islandlike active region is isolated just by a ring-shaped trench 20 of a predetermined width surrounding the outlines of the active region, without reference to the space between active regions, which is widely applied to isolation of electrical elements.

In order to isolate an active region, a sequence for the formation of an aperture with an insulating layer is first carried out to define active and passive regions on the semiconductor substrate. The size of the aperture is defined by the size of the active region, excluding the trench 20.

Figure 4A:
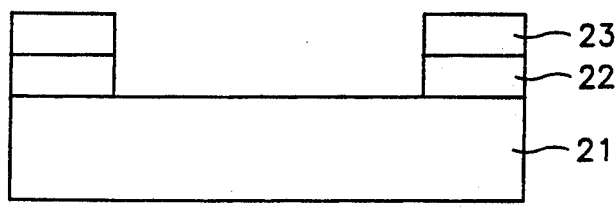

In FIG. 4A, a high temperature oxide film 22 is formed to a thickness of 3000 angstroms on a semiconductive substrate 21 by a thermal oxidation process or CVD process, and a passive region is defined by photoresists 23 through general photoetching. An opened area (aperture) in the B—B′ lines of FIG. 3 is identified by reference numeral "3", which includes the passive region and spacer regions 20. Accordingly, the silicon substrate 21 is exposed in the passive region except for the active regions covered with the high temperature oxide film 22.

Figure 4B:
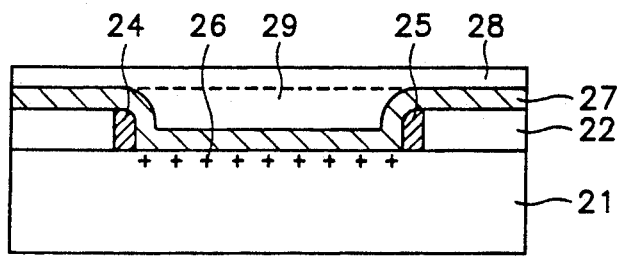

The passive region include the ring-shaped trench regions, and spacers 24, 25 are formed on the sidewalls of the aperture to define the trench regions having the width as predetermined in FIG. 4B. The spacers 24, 25 will be selectively etched to be removed, and therefore, they must be formed of a material of an etch rate different from that of the high temperature oxide film 22 forming the aperture. Polysilicon is used in the present embodiment.

In order to form the spacers, 24, 25 a polysilicon layer is formed to a thickness of 1000 angstroms on the area of the substrate 21 where the aperture is formed, and etched to the high temperature oxide film 22 through anisotropic etching such as reactive ion etching (RIE) to form the spacers 24 and 25.

It is necessary to form an impurity layer for a channel stop on the substrate corresponding to the isolation region, and as shown in FIG. 4B, ion implantation is carried out so as to form a p+ doping layer 26 in the case of the p-type substrate.

After the ion implantation, the area of the silicon substrate 21 underneath the aperture is in the state of exposure, and must be protected at the time of removing the spacers or forming trenches. Thus, in order to form a masking layer at the time of forming the trenches, a material of etch rate different from that of the high temperature oxide film 22 and that of the spacers 24, e.g. a silicon nitride layer (SiN) 27 is deposited to a thickness of 1500 angstroms on the substrate. Further, a spin-coated photoresist layer 28 is coated over the SiN layer 27 and is etched back to give a planar surface through anisotropic etching. In addition, with refilling a dimple 29 is formed inside the passive region, as shown in FIG. 4C.

The etching is carried out to expose the silicon nitride layer 27, and a residue of the photoresist layer 28 forms the dimple 39 within the passive region. Dotting in the photoresist layer 28 in FIG. 4B designates the boundary of the photoresist layer 29 which is to remain according to the above process. Its result is illustrated in FIG. 4C, and a process in the formation of the planar silicon nitride layer within the passive region will be described hereinafter.

The SiN layer 27 within the passive region serves as a trench buffer layer at the time of the formation of trenches, and must be planarized in order to be formed without step-like difference.

Figure 4C:
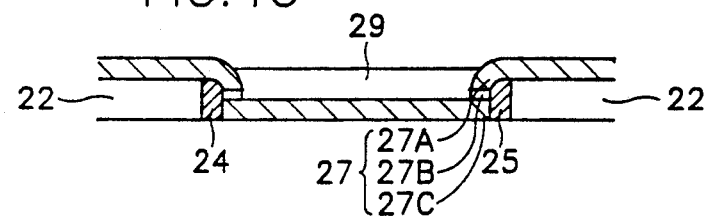
Figures 1, 4C:
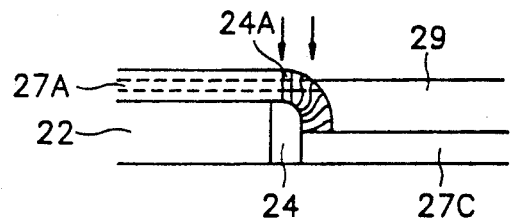

In the step of FIG. 4C, each of the spacers 24 and 25 must be exposed as broad as its width to form trenches, and at the same time, the silicon nitride layer 27 between the spacers must be planarized, too.

Figure 1:
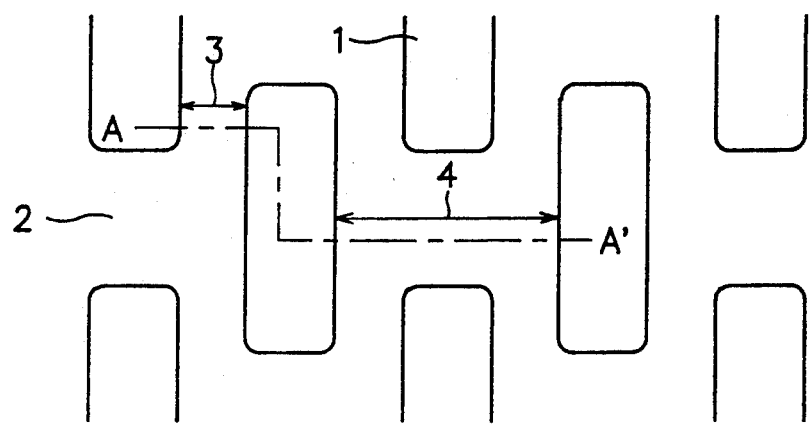
FIG. 1 is a plan view of a semiconductor substrate on which active and passive regions are formed.

Thus, in the present embodiment, only a part identified by 27A or 27B in the silicon nitride layer 27 is designed to be removed by plasma etching processes, anisotropic etching. As shown in FIG. 4C-1, etch species of the plazma etching reacts upon a rounded contour 24A of the spacer 24, and the silicon nitride layer 27A is removed by etching to a depth below the photoresist layer 29. If an overetching by the control of time is carried out, the silicon nitride layer 27A and/or 27B can be removed.

Figures 2, 4C:
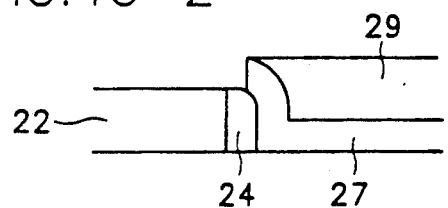
Figures 3, 4C:
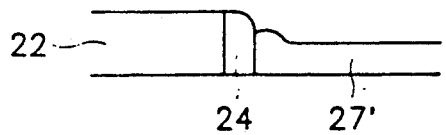

If the reactive ion etching processes were used among dry etch processes, however, just the vertical etching profile would be produced, as shown in FIG. 4C-2, and there occurs a problem that an undulate silicon nitride layer 27 is obtained after removal of the photoresist layer 29. Accordingly, the present invention solves such a problem by carrying out etching processes as follows.

After the photoresist layer 29 is removed in the step of FIG. 4C-2, the silicon nitride layer 27 is wet-etched as designated by reference numeral 27' of FIG. 4C-3. Accordingly, a surface that reacts with a solution of phosphoric acid is larger within the exposed area of the substrate than that in the other region thereby obtaining topology that is relatively planar and substantially rounded. In the preferred embodiment of the present invention, the silicon nitride layer 27 that is etched in the above process is deposited to a thickness of 1500 angstroms. If the trench depth is 1 μm, the silicon nitride layer 27 having a thickness of at least 1000 angstroms can serve as a buffer layer satisfactorily. Therefore, the silicon nitride layer 27 may be overetched without any limitation of region. If the silicon nitride layer 27 is partially etched to keep the thickness of 1500 angstroms, a part of the photoresist 29 can be included within the etched silicon nitride layer 27C as shown in FIG. 4D, or the photoresist layer 29 can remain being in contact with the surface of the silicon nitride layer, in the case of overetching.

Figure 4D:
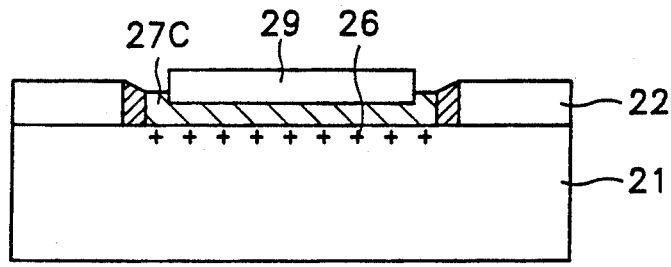

FIG. 4D illustrates the partially-etching of the silicon nitride layer 27, using the high temperature film 22 as an endpoint. Successively, the photoresist film 29 is removed, or preferably, a photosensitive film is oxidized to be removed through a plasma process.

The spacers 24 and 25 are made to contact the sidewalls of the aperture within the passive region. Inside these spacers, the silicon nitride layer 27C overlies the silicon substrate 21, and serves as a buffer layer at the time of the formation of trenches, as mentioned above.

Figure 4E:
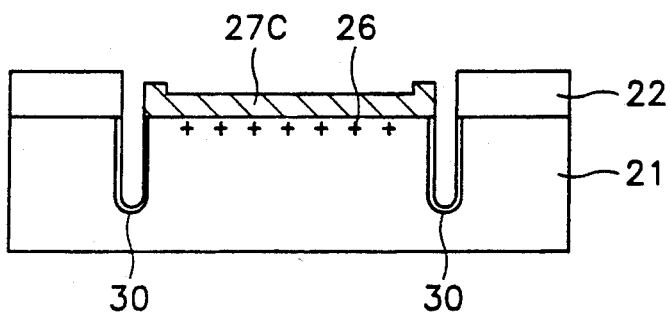

Referring to FIG. 4E, the remaining photoresist film 29, if any, the spacers 24, 25 and portions of the silicon substrate 21 below the spacers 24, 25 are removed by a wet etching process, and trenches of a predetermined depth are then formed by an anisotropic etching method, in accordance with the exposed area of the silicon substrate 21. Processes of refilling the trenches are carried out as follows: after oxide layers 30 are formed inside the trenches by, e.g. a thermal oxidation process such that defects of the silicon nitride layer 27C on the inside of the trenches are compensated.

Figure 4F:
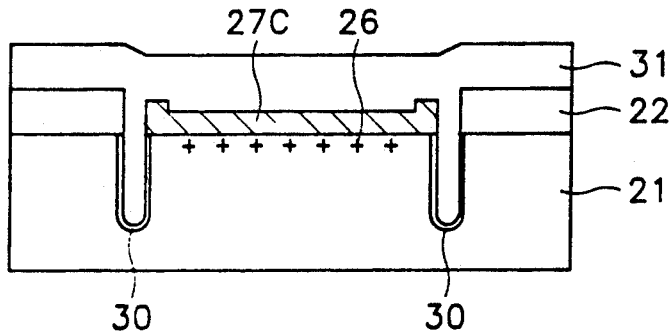
Figure 4G:
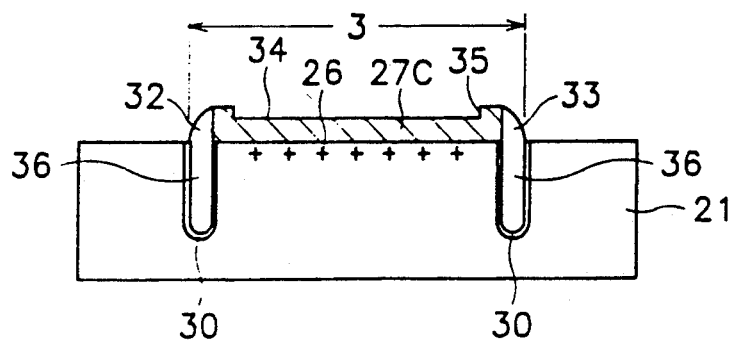

FIGS. 4F and 4G depict the processes of refilling the trenches. In the present embodiment, a second high temperature oxide film 31 is deposited on the substrate 21, like the high temperature oxide film 22 supporting the aperture. The second high temperature oxide film 31 will be then under the same processes as those on the high temperature oxide film 22. That is to say, the high temperature oxide films 31 and 22 are etched through dry-etching to expose the silicon substrate 21, and spacers 32 and 33 are then formed on each sidewall of the silicon nitride layer 27C. These spacers 32 and 33 and silicon nitride layer 27C occupy the passive region without step-like difference to form an isolation region. The inside layer 34 of the silicon nitride layer 27C is a little dimpled, and small spacers (not illustrated) may be formed on each sidewall 35 of the inside layer 34 due to the high temperature oxide film 31, which is irrelative to the characteristic of the present invention. This does not give a deterioration to step coverage, and topology of smooth surface can be obtained.

A part identified by reference numeral "3" of FIG. 4G corresponds to the part identified by "3" of FIG. 3, and the wider trench 4 of FIG. 3 is similar to the above case.

Necessary elements are in formed on the active regions that is obtained with the semiconductor wafer. Isolation of the electrical elements is thus completed.

Figure 2A:
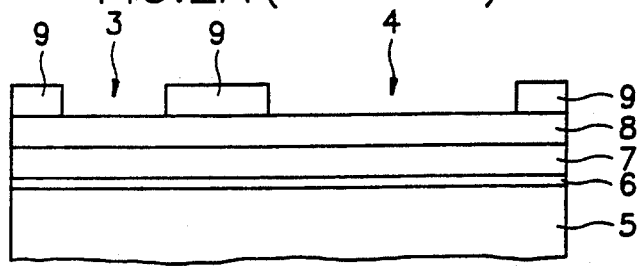
FIGS. 2A to 2E illustrate steps in the manufacture of a passive region (isolation region) by trenches in accordance with FIG. 1.
Figure 2B:
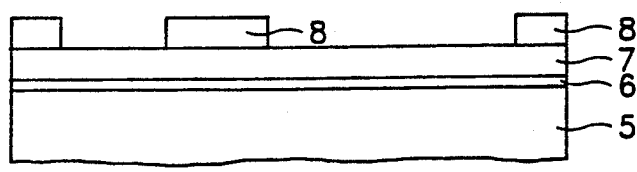
Figure 2C:
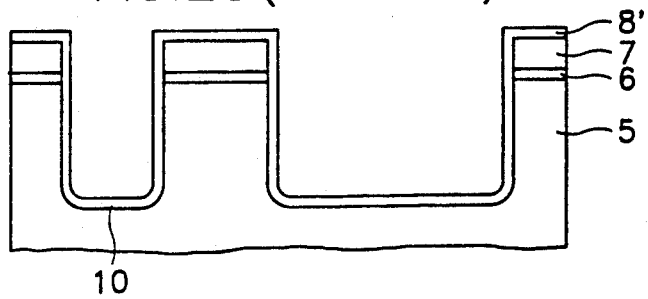
Figure 2D:
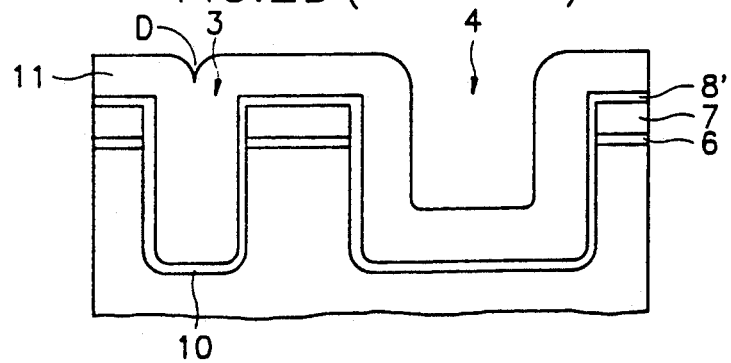
Figure 2E:
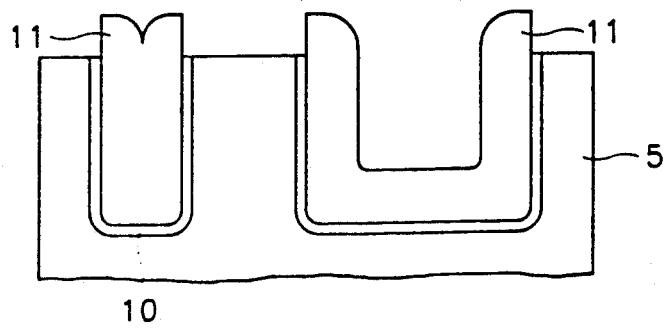
Figure 5:
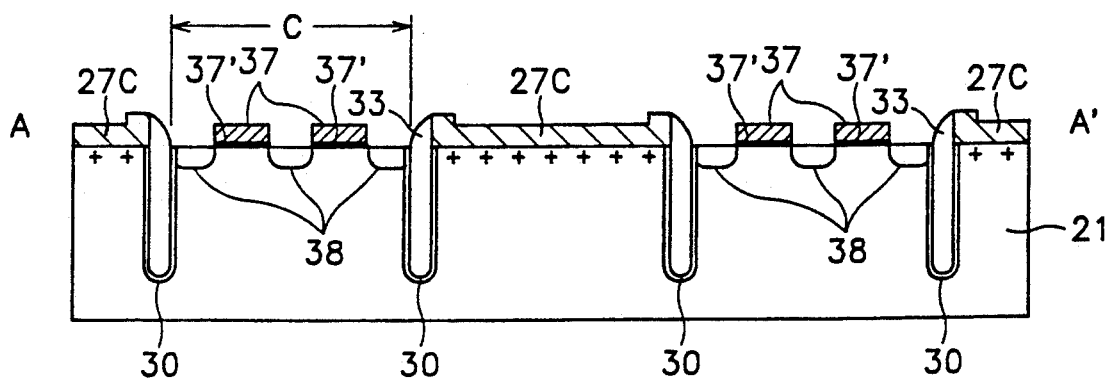
FIG. 5 is a sectional view as taken along lines A—A′ of FIG. 3.

Referring now to FIG. 5, a preferred embodiment of forming a pair of metal-insulator semiconductor field effect transistors on the active region "C" will be described. A thin oxide layer 37' is formed on the exposed semiconductor substrate 21 of an active region through a thermal process, and gate electrodes 37 of a predetermined width are then formed of polysilicon. This formation would traverse over the isolation region as shown in FIG. 4G if it was arranged horizontally, like FIG. 3. Furthermore, this formation is fundamentally different from that of FIG. 2E such that deterioration to step coverage is prevented by supply of good topology, and the delay of transmitting signal is then improved. Source/drain regions 38 are formed on each side of the gate electrodes 37 to form a metal-insulator semiconductor field effect transistor. The arrangement as shown in FIG. 3 is useful for a semiconductor memory device that is formed on a matrix array, and is an example concerning isolation of electrical elements according to the present invention.

In order to achieve the object of the present invention, a second preferred embodiment is now described, referring to FIGS. 6A to 6F.

The formation of active and passive regions of a semiconductor device which a second embodiment of the present invention is applied to, is the same as that of FIG. 1.

A first process begins with the definition of a passive region similarly to a conventional embodiment. Necessary elements are formed on the active regions after the formation of the isolation regions. Therefore, a pad oxide film 61, a silicon nitride film 62 and a high temperature oxide film 63 are serially formed to a thickness of 240 angstroms, 1500 angstroms and 1000 angstroms, respectively on a semiconductor substrate 60, and an aperture is formed by a photo-etching method.

Figure 6A:
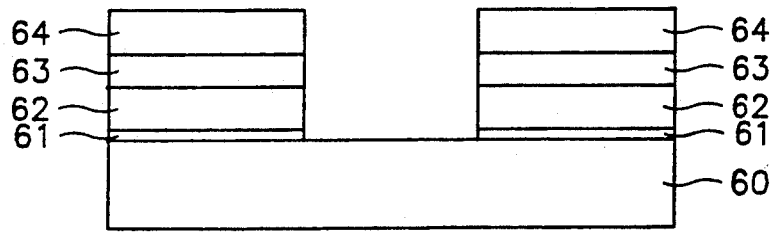
FIGS. 6A to 6F depict the steps in the manufacture of an isolation region as a second preferred embodiment of the present invention.

The pad oxide film 61 is thermally grown, and the silicon nitride film 62 and high temperature oxide film 63 are formed by a chemical vapor deposition or low pressure chemical vapor deposition. In the aperture patterned by a photoresist layer 64, the insulating layers formed on the substrate 60 are etched through a dry-etching such as a reactive ion etching to define a passive region as indicated in FIG. 6A. The aperture width is formed to a thickness of, i.e. 0.4 to 0.5 μm.

Figure 6B:
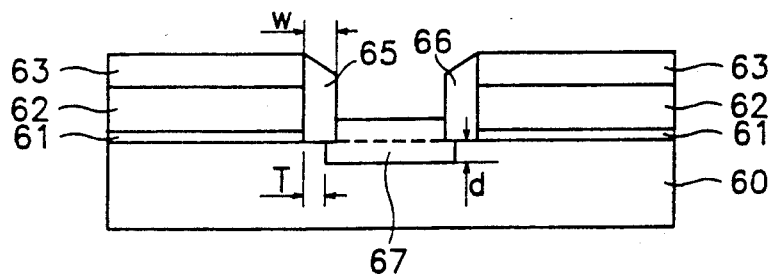

The photoresist layer 64 formed for the formation of the aperture is removed, and processes in the formation of spacers are then performed, as shown in FIG. 6B.

Spacers are formed through dry-etching after, i.e. a nitride film or a polysilicon film is applied to the substrate 60, and what is important in this step is a width of the spacers 65 and 66. This width is defined by including a width of ring-shaped trenches surrounding the outlines of the active regions, and the width is maintained to form the spacers.

According to this embodiment, a trench width of 700 angstroms "T" in the aperture having a width of 0.4 to 0.5 μm is designed to be formed, and the spacers 65, 66 having a width of "W" in which the trench width T and a margin width are included. Specifically, the total thickness of the three deposited insulating layers 61, 62, 63 defining the aperture is designed to be 2740 angstroms, and the thickness of the nitride film deposited on the substrate 60 is 1500 angstroms. The spacers 65, 66 are formed through anisotropic etching in order that the spacer width W is maintained to be 700 to 1000 angstroms. Simultaneously with this, the area of the substrate 60 inside the aperture defined by the spacers 65, 66 is designed to be exposed.

An insulating layer is formed on the exposed area of the substrate 60 within the aperture after the spacers 65, 66 having the width W are formed. When a thermal oxidation process is performed on the exposed area of the substrate 60 made of silicon, the silicon is exhausted towards the substrate 60 and gradually becomes a thermal oxide layer 67 that is formed under the level of the substrate 60 and widely more than the region defined by the spacers.

The process conditions are adjusted in order that a thickness of the thermal oxide layer 67 is formed to be approximately 1000 angstroms, and thus, half of the insulating layer 67 is formed inside the silicon substrate 60. This process aims at the formation of an isolation region having good step coverage. It is important that the trench width T is in proportion to the thickness of the oxide layer 67, and in mutual subordinate relationship with it. The trenches are refilled through a following thermal oxide process, and the extent of this refilling has relation to the thermal oxide layer thickness d formed below the level of the substrate 60.

Therefore, it is important that the process conditions are adjusted by forming the spacer width W enough in consideration that the thickness d of the thermal oxide layer 67 is related to the trench width T and this trench width T may be expanded horizontally at the time of the growth of the thermal oxide layer 67.

In the step of FIG. 6B, the thermal oxide layer 67 is formed to be expended vertically and horizontally, and each spacer 65 and 66 is removed through wet-etching by a solution of phosphoric acid such that the silicon substrate 60 is exposed to the extent of the trench width T. The difference between the spacer width and the trench width results from the thermal oxide process in the step of FIG. 6B.

The predetermined numerical values presented in the invention are illustrative, and the trench width can be controlled. Thus, the thickness of the thermal oxide layer 67 does not have to be limited to 1000 angstroms.

Figure 6C:
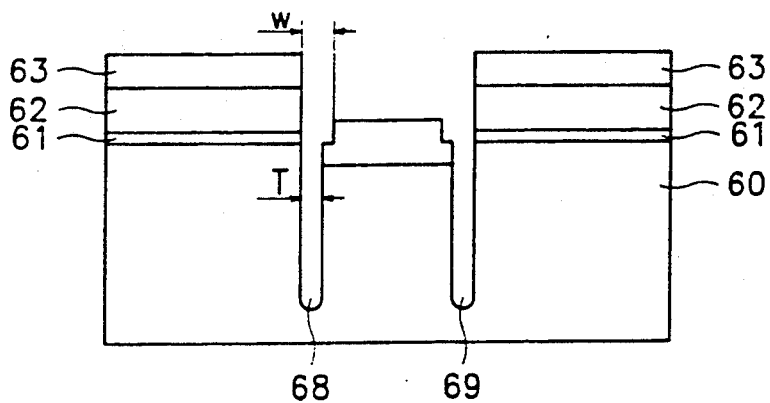
Figure 6D:
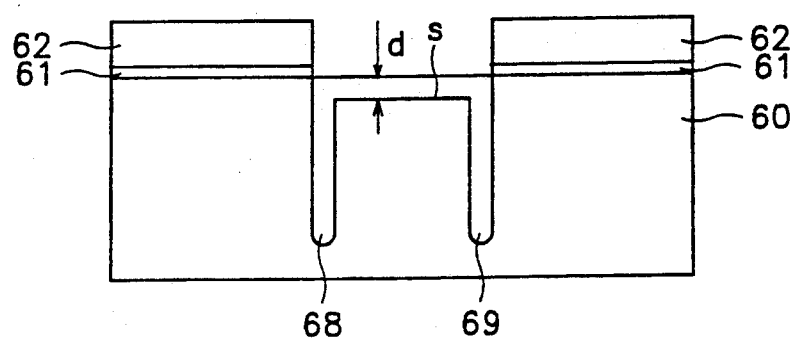

As indicated in FIG. 6C, trenches 68, 69 of a predetermined depth are formed through dry-etching, in the substrate 60. The trenches 68, 69 having a predetermined width are formed on the both sidewalls of the aperture. The trenches 68, 69 are formed to be below 1000 angstroms, for example, about 700 angstroms, and the thermal oxide layer 67 serving as a buffer layer is removed through dry-etching after the formation of the trenches such that the substrate is exposed, as shown in FIG. 6D.

Accordingly, there is obtained inside the aperture, a planar surface S of the substrate 60 having a depth of "d", i.e. 45% of the thermal oxide layer depth, and the trenches 68, 69 are formed on both sides of this planar surface S.

Since the inside of the trenches should be refilled with a proper material, the following process is required.

Figure 6E:
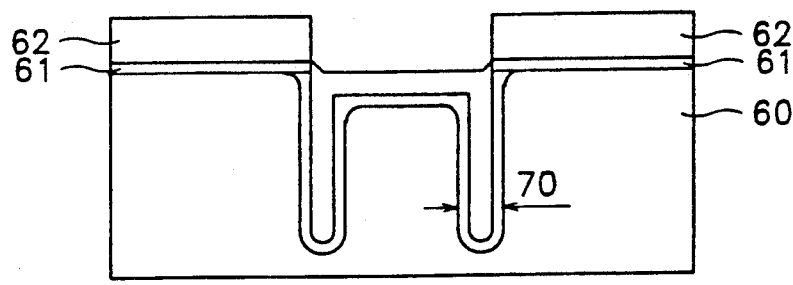

The present embodiment relates to the planarization of the isolation region. Therefore, the trenches 68, 69 are refilled with a thermal oxide material by carrying out a thermal oxide process on the exposed substrate, as shown in FIG. 6E, and simultaneously with this, a planar oxide film is formed to a height of "d". The trench width T is 700 angstroms in the present embodiment, and the thickness d of the thermal oxide layer 70 is formed to be about 1500 to 3000 angstroms. The thermal oxide layer covering the surface of the passive region is formed to be almost the same level as that of the substrate 60. The thermal oxidation step of FIG. 6E is similar to the process in the formation of field oxide films that is carried out in LOCOS.

Figure 6F:
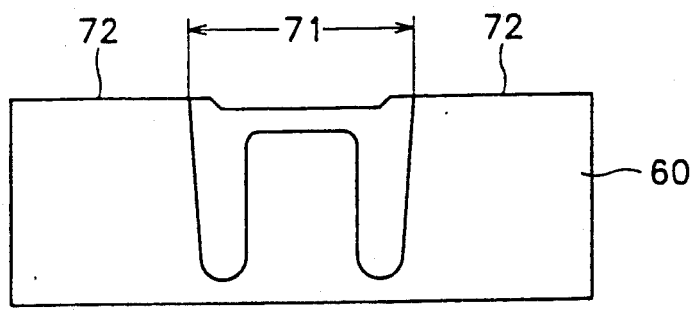

The isolation region 71 in the present embodiment is formed through the presence as mentioned above, and the nitride film 62 and pad oxide film 61 are removed by a wet-etching method to expose the active regions 72 thereby obtaining a semiconductor device having the isolation region 71, as shown in FIG. 6F.

The isolation region 71 having a width of 0.5 μm is formed to meet the microminiaturization requirements and have good step coverage. A semiconductor device is obtained by forming semiconductor elements on the active region 72 formed on the both sides of the isolation region 71. Further, since there is no step-like difference in the formation of films traversing the passive region 71 at the time of metallization between the active regions 72, it is advantageous to carry out the processes, and the above embodiments have no problems of delay in transmitting signals along electrically-wired lines or short-circuit of lines that have a microscopic width by conventional step-like difference.

As can be seen from the above first and second embodiments of the present invention, the planarization degree on the isolation region according to the present invention can be controlled in accordance with the thickness of the thermal oxide film formed on the exposed passive region within the aperture at the time of the thermal oxide processes after the formation of the trenches, or after the formation of the spacers.

Further, since unwanted encroachment by an undesirable configuration resembling that of a bird's beak can be prevented, it is possible to form minute electrical elements by controlling the trench width according to the present invention so that, ultra-high integrated semiconductor devices can be manufactured. In addition, step-like difference can be controlled by controlling the trench depth and silicon nitride film 27C thereby providing adaptability to a design for semiconductor devices.

What is claimed is:

1. A method of making a semiconductor device comprising the step of forming at least one layer of an insulating film on a surface of a semi-conductor substrate;

removing portions of said insulating film from said surface of the substrate to form a plurality of passive regions exposing said surface and a plurality of active regions with said insulating film thereon;

forming a pair of spacers of an etch rate different from the etch rate of said insulating film on said substrate surface and on opposite sides of at least one passive region;

forming a second layer of an insulating film on at least said surface of said substrate between said pair of spacers, said second layer having an etch rate different from said etch rate of said spacers;

etching said spacers from said substrate to expose said substrate surface thereat;

removing portions of the exposed substrate to form a pair of trenches in said substrate on opposite sides of said one passive region;

forming a third layer of a high-temperature insulating film over the remaining portions of said one layer, the remaining portions of said second layer of insulating film and each passive region while filling each trench with the material of said third layer; and thereafter etching the high-temperature film and remaining portions of said one layer from the substrate to expose said active regions while retaining said remaining portions of said second layer and while retaining the material in said trenches as spacers in each passive region.

2. A method as set forth in claim 1 wherein said second layer of insulating film is made of silicon nitride.

3. A method as set forth in claim 2 wherein said third layer is made of an oxide.

4. A method as set forth in claim 1 which further comprises the step of forming a doping layer on said exposed surface of said substrate prior to said step of forming said second layer of an insulating film thereon.

5. A method as set forth in claim 1 which further comprises the step of forming an oxide layer over the inside surfaces of each trench prior to said step of forming said second film.

6. A method as set forth in claim 1 wherein each of said pair of spacers is made of polysilicon.

7. A method as set forth in claim 1 which further comprises the steps of depositing a layer of silicon nitride over the remaining portions of said one layer, said spacers and said exposed surfaces of said substrate; thereafter spin-coating a photoresist film over said layer of silicon nitride; and dry etching said photoresist film to expose portions of said silicon nitride layer over said active regions while leaving a dimple of photoresist film within each passive region prior to said step of forming said second layer of insulating film between said pair of spacers.

8. A method as set forth in claim 7 which further comprises the steps of etching the silicon nitride layer from over said active regions; and wet-etching said dimple from each passive region while etching said silicon nitride layer from over each spacer in each passive region to form said second layer of insulating film in each passive region.

9. A method as set forth in claim 1 wherein each trench of a respective passive region surrounds a respective active region.

10. A method of making a semiconductor device comprising the steps of forming at least one layer of an insulating film on a surface of a semi-conductor substrate;

removing portions of said insulating film from said surface of said substrate to form a plurality of passive regions exposing said surface and a plurality of active regions with said insulating film thereon;

forming a pair of spacers of an etch rate different from the etch rate of said insulating film on said substrate surface on opposite sides of at least one passive region;

forming an insulative layer on the exposed surface of said substrate in each passive region between said spacers;

thereafter removing said spacers to expose the surface of said substrate thereunder;

thereafter removing portions of the exposed substrate to form a pair of trenches in said substrate on opposite sides of said one passive region;

removing said insulating layer on said substrate in said one passive region;

thereafter filling each trench in said one passive region with a thermal oxide material while forming a layer of the oxide material across said one passive region with an exposed planar surface; and thereafter removing the insulating film over said active regions.

11. A method as set forth in claim 10 wherein the thermal oxide material layer is formed to almost the same level as said substrate surface.

* * * * *

UNITED STATES PATENT AND TRADEMARK OFFICE
CERTIFICATE OF CORRECTION

PATENT NO. : 5,308,784
DATED : May 3, 1994
INVENTOR(S) : YUNGI KIM, et al

It is certified that error appears in the above-identified patent and that said Letters Patent is hereby corrected as shown below:

Column 2, line 3 "ad" should be -as-

Line 8 delete "6"

Line 9 after "pad oxide film" insert -6-

Line 66 change "space" to -spacer-

Column 6, line 34 change "in" to -then-

Column 8, line 43 change "presence" to -processes-

Signed and Sealed this

Thirteenth Day of September, 1994

Attest:

BRUCE LEHMAN

*Attesting Officer*   *Commissioner of Patents and Trademarks*